United States Patent
Karlquist

(10) Patent No.: US 7,176,447 B2
(45) Date of Patent: Feb. 13, 2007

(54) ELECTRO-OPTIC DELAY LINE FREQUENCY DISCRIMINATOR

(75) Inventor: Richard K Karlquist, Cupertino, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 142 days.

(21) Appl. No.: 11/075,168

(22) Filed: Mar. 8, 2005

(65) Prior Publication Data

US 2006/0202110 A1    Sep. 14, 2006

(51) Int. Cl.
*G01J 1/04* (2006.01)

(52) U.S. Cl. .................... 250/227.12; 250/216; 372/26

(58) Field of Classification Search ........... 250/227.12, 250/227.23; 359/325, 326, 331; 356/350, 356/464; 398/192, 188
See application file for complete search history.

(56) References Cited

U.S. PATENT DOCUMENTS

| | | |
|---|---|---|
| 5,170,225 A | 12/1992 | Ferrar |
| 6,462,850 B1 | 10/2002 | Gehlot |
| 6,580,532 B1 | 6/2003 | Yao et al. |
| 6,891,149 B1 * | 5/2005 | Lewis .................... 250/227.14 |

\* cited by examiner

*Primary Examiner*—Thanh X. Luu
*Assistant Examiner*—Tony Ko
(74) *Attorney, Agent, or Firm*—Robert T. Martin

(57) ABSTRACT

An electro-optic delay line frequency discriminator has an optical signal source providing first and second optical signals that are directed along first and second paths, respectively. In the first path, the first optical signal is converted to a first corresponding optical signal that corresponds to an electrical input signal, and the first corresponding optical signal is then delayed. In the second path, the second optical signal is delayed, and the delayed second optical signal is then converted to a second corresponding optical signal that corresponds to the electrical input signal. The first and second corresponding optical signals are converted to first and second corresponding electrical signals, respectively; and a detector, responsive to the first and second corresponding electrical signals, provides an electrical output signal from the discriminator. Optical source relative intensity noise (RIN) is canceled out and does not degrade the signal-to-noise ratio of the discriminator output.

17 Claims, 4 Drawing Sheets

ELECTRO-OPTIC DELAY LINE FREQUENCY DISCRIMINATOR

BACKGROUND OF THE INVENTION

1. Technical Field of the Invention

The present invention relates generally to the field of delay line frequency discriminators. More particularly, the invention relates to an electro-optic delay line frequency discriminator, and to a method for reducing noise in an electro-optic delay line frequency discriminator.

2. Background of the Invention

A frequency discriminator (hereinafter referred to as a "discriminator") performs frequency demodulation, producing an output signal that is proportional to an input frequency. A particular type of discriminator, a delay line discriminator, uses a transmission line to produce a delay. The basic principle of operation of a delay line discriminator is that the phase shift of the output signal of a delay line is proportional to frequency. The phase of the delayed signal is compared to the phase of the undelayed signal at the input to the delay line by a phase detector. The output of the phase detector is proportional to the phase difference between its two outputs; and, hence, is also proportional to the input frequency, as required for proper discriminator action. Delay lines are used in many applications to delay one signal with respect to another. The lowest modulation frequency that can be demodulated by a discriminator is determined by the length of the delay.

Electrical delay line discriminators implement the delay with an electrical transmission line; however, if good low frequency response is needed, the electrical transmission line is generally quite long and introduces substantial signal loss, resulting in poor signal-to-noise ratio. Optical fibers are known that introduce very little signal loss; and, as a result, electro-optic delay line discriminators have been developed that have an electrical input and output, but that have internal electrical-to-optical and optical-to-electrical conversions to allow the delay to be implemented optically with an optical fiber transmission line.

An electro-optic delay line discriminator usually employs a laser to provide an optical signal source; however, the output of a laser exhibits relative intensity noise (RIN). In conventional electro-optic delay line discriminators, this laser noise degrades the signal-to-noise ratio at the output of the discriminator. There is a trade-off in laser design between low RIN versus size, power complexity and cost.

There is, accordingly, a need for an electro-optic delay line discriminator that is substantially immune to laser RIN.

SUMMARY OF THE INVENTION

The present invention provides an electro-optic delay line discriminator that is substantially immune to laser RIN, and a method for reducing noise in an electro-optic delay line discriminator.

An electro-optic delay line discriminator according to embodiments of the invention has an optical signal source providing first and second optical signals that are directed along first and second paths, respectively, of the discriminator. Each path has an electrical-to-optical converter for converting the first and second optical signals to first and second corresponding optical signals, respectively, that correspond to an electrical input signal, an optical delay line for delaying the first corresponding optical signal or second optical signal, and an optical-to-electrical converter for converting the first and second corresponding optical signals to first and second corresponding electrical signals. The electrical-to-optical converter amplitude-modulates the optical signal passing through it; and, conversely, the optical-to-electrical converter is an amplitude demodulator. A phase detector, responsive to the first and second corresponding electrical signals, provides an electrical output signal from the electro-optic delay line discriminator.

In the first path, the optical delay line follows the electrical-to-optical converter. Accordingly, the corresponding optical signal in the first path is delayed; and, hence, the converted first corresponding electrical signal is delayed. In the second path, however, the optical delay line precedes the electrical-to-optical converter. Accordingly, the second corresponding optical signal is not delayed; and hence, the second corresponding electrical signal is not delayed, thus providing a proper condition for operation of the detector.

The optical delay line in the second path does, however, function to delay the second optical signal in the second path to compensate for the delay of the first optical signal in the first path such that the delay of optical signals, as measured from the laser to the phase detector, will be equal. Therefore, RIN will produce identical electrical outputs from both optical-to-electrical converters; and, thus, be common mode and cancel out.

BRIEF DESCRIPTION OF THE DRAWINGS

Furthermore, the invention provides embodiments and other features and advantages in addition to or in lieu of those discussed above. Many of these features and advantages are apparent from the description below with reference to the following drawings.

DETAILED DESCRIPTION OF THE EMBODIMENTS OF THE INVENTION

Embodiments in accordance with the invention provide an electro-optic delay line discriminator, and a method for reducing noise in an electro-optic delay line discriminator.

Figure 1:
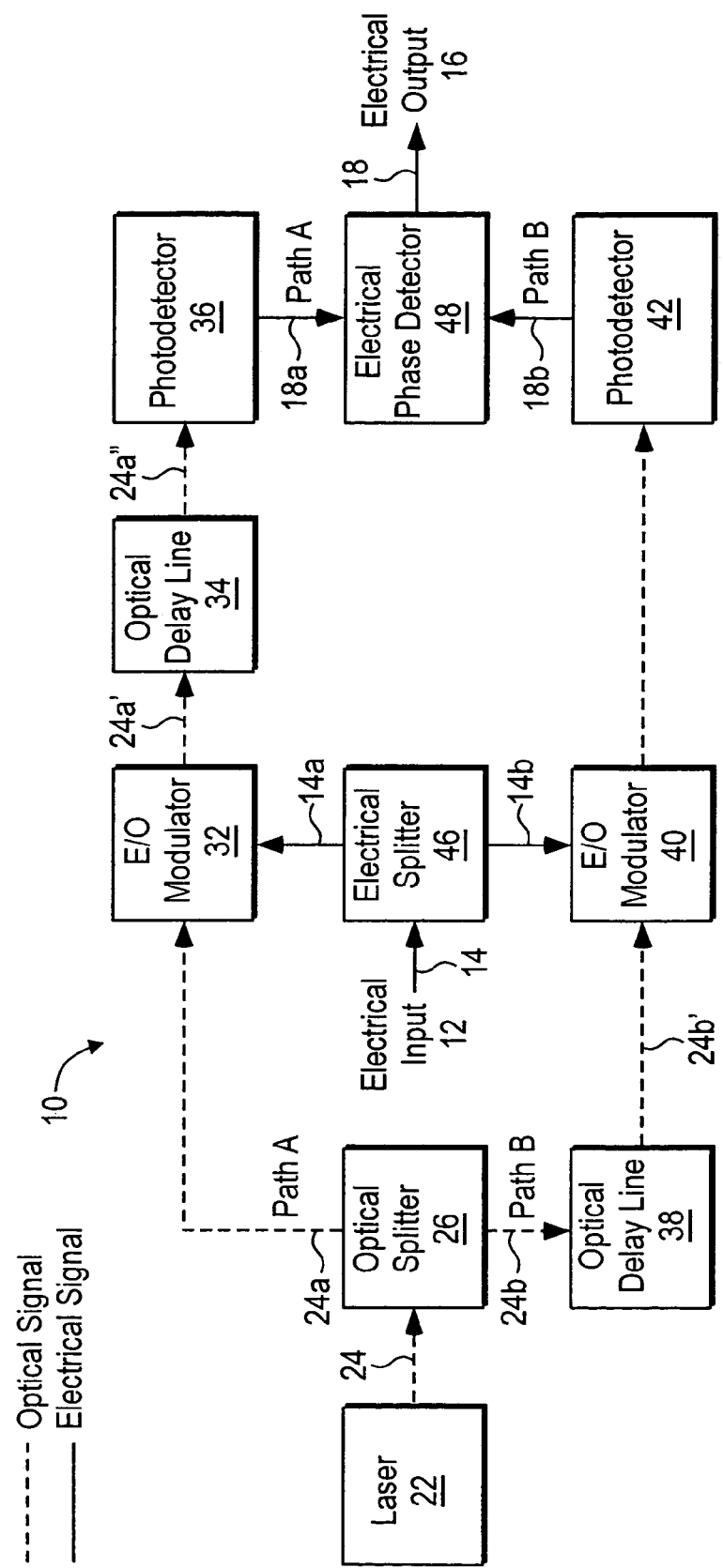
FIG. 1 is a block diagram that schematically illustrates an electro-optic delay line discriminator according to an embodiment of the invention.

FIG. 1 is a block diagram that schematically illustrates an electro-optic delay line discriminator according to an embodiment of the invention. The electro-optic delay line discriminator is generally designated by reference number 10, and has electrical input 12 for inputting electrical signal 14 into the discriminator, and electrical output 16 for outputting electrical signal 18 from the discriminator. Electro-optic delay line discriminator 10 also has laser optical signal source 22 to provide optical signal 24 in the discriminator (in FIG. 1, electrical signals traveling through electro-optic delay line discriminator 10 are represented by solid lines, and optical signals traveling through the discriminator are represented by dashed lines).

Optical signal 24 is split into two optical signals 24a and 24b by optical splitter 26. Optical signals 24a and 24b are directed through electro-optic delay line discriminator 10 along separate paths, designated as Path A and Path B in FIG. 1. Path A includes, in order, electro-optic modulator (E/O modulator) 32, optical delay line 34 and photodetector 36. Path B includes, in order, optical delay line 38, E/O modulator 40 and photodetector 42.

Electrical input signal 14 is split into two electrical input signals 14a and 14b by electrical splitter 46. Electrical input signal 14a is input into E/O modulator 32 in Path A, and electrical input signal 14b is input into E/O modulator 40 in Path B.

E/O modulators 32 and 40 function as electrical-to-optical converters to convert electrical input signals 14a and 14b to corresponding optical signals. Optical delay lines 34 and 38 function to delay optical signals passing through them, and, in the embodiment described herein, are implemented by optical fibers. Photodetectors 36 and 42 function as optical-to-electrical converters to convert optical signals to corresponding electrical signals.

In Path A of electro-optic delay line discriminator 10, optical signal 24a is input to E/O modulator 32. E/O modulator 32 amplitude modulates optical signal 24a in response to electrical input signal 14a, and outputs modulated optical signal 24a' that corresponds to electrical input signal 14a. Modulated optical signal 24a' is then input to optical delay line 34. Optical delay line 34 delays modulated optical signal 24a' and outputs delayed, modulated optical signal 24a".

In Path B of electro-optic delay line discriminator 10, optical signal 24b is input to optical delay line 38. Optical delay line 38 delays optical signal 24b and outputs delayed optical signal 24b'. Delayed optical signal 24b' is then input to E/O modulator 40. E/O modulator 40 amplitude modulates delayed optical signal 24b' in response to electrical input signal 14b, and outputs modulated, delayed optical signal 24b" that corresponds to electrical input signal 14b.

Delayed, modulated optical signal 24a" output from optical delay line 34 in Path A, and modulated, delayed optical signal 24b" output from E/O modulator 40 in Path B are input to photodetectors 36 and 42 in Paths A and B, respectively. Photodetector 36 converts delayed, modulated optical signal 24a" to corresponding electrical signal 18a, and photodetector 42 converts modulated, delayed optical signal 24b" to corresponding electrical signal 18b. Electrical signals 18a and 18b are input to and drive electrical phase detector 48, and electrical phase detector 48 outputs electrical signal 18 from electrical output 16 as the output of electro-optic delay line discriminator 10.

As described above, in Path A of electro-optic delay line discriminator 10, optical delay line 34 follows E/O modulator 32. Accordingly, in Path A, optical signal 24a is first modulated by E/O modulator 32 in response to electrical input signal 14a, and optical delay line 34 then delays modulated optical signal 24a' output from E/O modulator 32 and outputs delayed, modulated optical signal 24a". As a result, when delayed, modulated optical signal 24a" is converted back to corresponding electrical signal 18a by photodetector 36, corresponding electrical signal 18a will be delayed. In Path B of electro-optic delay line discriminator 10, on the other hand, optical delay line 38 precedes E/O modulator 40. Accordingly, in Path B, optical signal 24b is first delayed by optical delay line 38, and E/O modulator 40 then modulates delayed optical signal 24b' output from optical delay line 38 in response to electrical input signal 14b, and outputs modulated, delayed optical signal 24b". As a result, when modulated, delayed optical signal 24b" is converted back to corresponding electrical signal 18b by photodetector 42, corresponding electrical signal 18b will not be delayed. Because electrical signal 18a is delayed and electrical signal 18b is not delayed, electrical signal 18a is delayed with respect to electrical signal 18b, thus providing a proper condition for operation of phase detector 48.

In Path A of electro-optic delay line discriminator 10, because optical delay line 34 follows E/O modulator 32, and delays modulated optical signal 24a' output from E/O modulator 32, optical delay line 34 functions to delay both optical signal 24a and electrical input signal 14a. In path B of electro-optic delay line discriminator 10, however, optical delay 38 precedes E/O modulator 40; and, thus, functions to delay optical signal 24b but does not function to delay electrical input signal 14b. Optical delay line 38 thus functions as a compensating delay line to delay optical signal 24b in Path B from laser 22 by the same amount that optical signal 24a in Path A from laser 22 is delayed by optical delay line 34. As result, electro-optic delay line discriminator 10 does not function as a delay line discriminator of any RIN noise introduced by laser 22. In other words, compensating optical delay line 38 renders the RIN generated by laser 22 common mode, and the noise is thus canceled out and does not degrade the noise floor of the discriminator.

Figure 2:
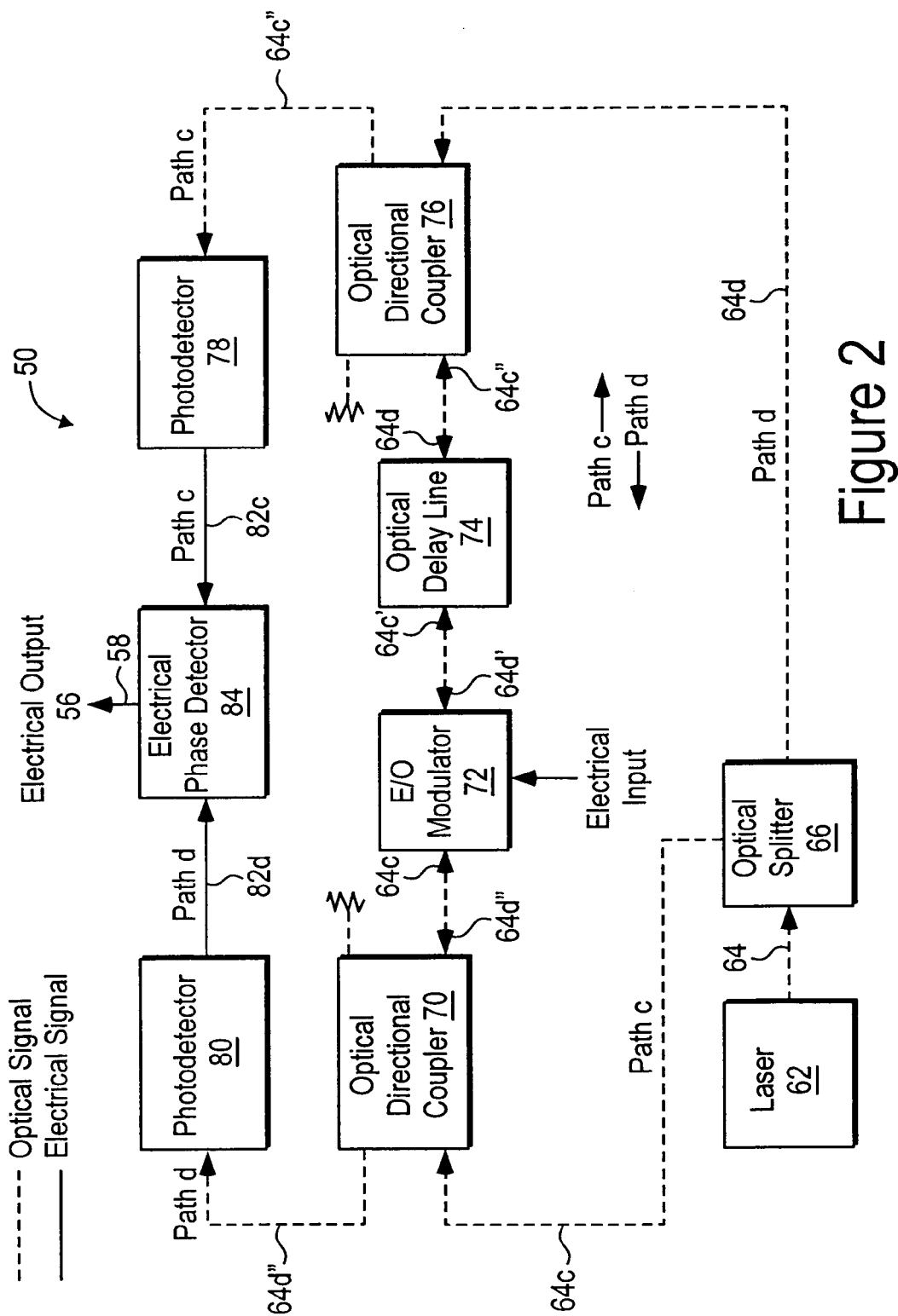
FIG. 2 is a block diagram that schematically illustrates an electro-optic delay line discriminator according to another embodiment of the invention.

FIG. 2 is a block diagram that schematically illustrates an electro-optic delay line discriminator 50 according to another embodiment of the invention. In the embodiment illustrated in FIG. 1, although any laser noise introduced in electro-optic delay line discriminator 10 is common mode; and, thus, cancelled out, any impairments that may exist in the discriminator due to differences between the individual optical delay lines 34 and 38 or the individual E/O modulators 32 and 40 will not be common mode; and, hence, will corrupt electrical output signal 18 from the discriminator. This potential problem is obviated in the embodiment illustrated in FIG. 2 by using a single optical delay line and a single E/O modulator in electro-optic delay line discriminator 50.

In particular, electro-optic delay line discriminator 50 has electrical input 52 for inputting electrical signal 54 into the discriminator, and electrical output 56 for outputting electrical signal 58 from the discriminator. Electro-optic delay line discriminator 50 also has laser optical signal source 62 to provide optical signal 64 in the discriminator (as in the embodiment of FIG. 1, electrical signals traveling through electro-optic delay line discriminator 50 are represented by solid lines, and optical signals traveling through the discriminator are represented by dashed lines).

Optical signal 64 is split into two optical signals 64c and 64d by optical splitter 66. Optical signals 64c and 64d are directed through electro-optic delay line discriminator 50 along separate paths, designated as Path C and Path D in FIG. 2. Path C includes, in order, optical directional coupler 70, E/O modulator 72, optical delay line 74, optical directional coupler 76 and photodetector 78. Path D includes, in order, optical directional coupler 76, optical delay line 74, E/O modulator 72, optical directional coupler 70 and photodetector 80. Thus, in the embodiment illustrated in FIG. 2, E/O modulator 72 and optical delay line 74 are included in both Path C and Path D of electro-optic delay line discriminator 50.

Electrical input signal 54 is input into E/O modulator 72. E/O modulator 72 functions as an electrical-to-optical converter for converting first and second optical signals 64c and 64d to corresponding optical signals. In the case of the configuration of FIG. 2, E/O modulator 72 and optical delay line 74 must be reciprocal, meaning that their function is independent of the direction of the light traveling through them. In particular, in Path C of electro-optic delay line discriminator 50, optical signal 64c is input, via optical directional coupler 70, to E/O modulator 72. E/O modulator 72 amplitude modulates optical signal 64c in response to electrical input signal 54, and outputs modulated optical signal 64c' that corresponds to electrical input signal 54. Modulated optical signal 64c' is then input to optical delay line 74. Optical delay line 74 delays modulated optical signal 64c' and outputs delayed, modulated output signal 64c".

In Path D of electro-optic delay line discriminator 50, optical signal 64d is input, via optical directional coupler 76, to optical delay line 74. Optical delay line 74 delays optical signal 64d and outputs delayed optical signal 64d'. Delayed optical signal 64d' is then input to E/O modulator 72. E/O modulator 72 amplitude modulates delayed optical signal 64d' in response to electrical input signal 54, and outputs modulated, delayed optical signal 64d" that corresponds to electrical input signal 54.

Delayed, modulated optical signal 64c", output from optical delay line 74 in Path C, and modulated, delayed optical signal 64d" output from E/O modulator 72 in Path D, are input to matched photodetectors 78 and 80, respectively, after passing through optical directional couplers 76 and 70, respectively. Photodetector 78 converts delayed, modulated optical signal 64c" to corresponding electrical signal 82c, and photodetector 80 converts modulated, delayed optical signal 64d" to corresponding electrical signal 82d. Electrical signals 82c and 82d are input to and drive electrical phase detector 84, and electrical phase detector 84 outputs electrical signal 58 at electrical output 56 as the output of electro-optic delay line discriminator 50.

In Path C of electro-optic delay line discriminator 50, optical delay line 74 follows E/O modulator 72. Accordingly, in Path C, optical signal 64c is first modulated by E/O modulator 72, and optical delay line 74 then delays modulated optical signal 64c' output from E/O modulator 72 and outputs delayed modulated optical signal 64c". As a result, when delayed, modulated optical signal 64c" is converted back to corresponding electrical signal 82c by photodetector 78, corresponding electrical signal 82c will be delayed.

In Path D of electro-optic delay line discriminator 10, on the other hand, optical delay line 74 precedes E/O modulator 72. Accordingly, in Path D, optical signal 64d is first delayed by optical delay line 74, and E/O modulator 72 then modulates delayed optical signal 64d' output from optical delay line 74 and outputs modulated, delayed optical signal 84d". As a result, when modulated, delayed optical signal 64d" is converted back to corresponding electrical signal 82d by photodetector 80, corresponding electrical signal 82d will not be delayed. Because corresponding electrical signal 82c is delayed and corresponding electrical signal 82d is not delayed, corresponding electrical signal 82c is delayed with respect to corresponding electrical signal 82d, thus providing a proper condition for operation of electrical phase detector 84.

As in the embodiment of FIG. 1, because, in Path C of electro-optic delay line discriminator 50, optical delay line 74 follows E/O modulator 72, and delays modulated optical signal 64c' output from E/O modulator 72, optical delay line 74 functions to delay both optical signal 64c and electrical input signal 54. In path D of electro-optic delay line discriminator 50, however, optical delay line 74 precedes E/O modulator 72 and, thus, functions to delay optical signal 64d but does not function to delay electrical input signal 54. Optical delay line 74 in Path D thus functions as a compensating delay line to delay optical signal 64d in Path D from laser 62 by the same amount that optical signal 64c in Path C from laser 62 is delayed by optical delay line 74 in Path C. As result, optical delay line 74 functions as a compensating delay line in Path D to render RIN common mode. The laser's RIN is thus cancelled out and does not degrade the noise floor of the discriminator. Because the electrical modulation is applied and detected differentially, it is immune to the laser noise.

In addition, because, in the embodiment illustrated in FIG. 2, the optical signals are sent bidirectionally through a single optical delay line 74 and a single E/O modulator 72, any reciprocal impairments in those elements will also be common mode and will cancel out.

Figure 3:
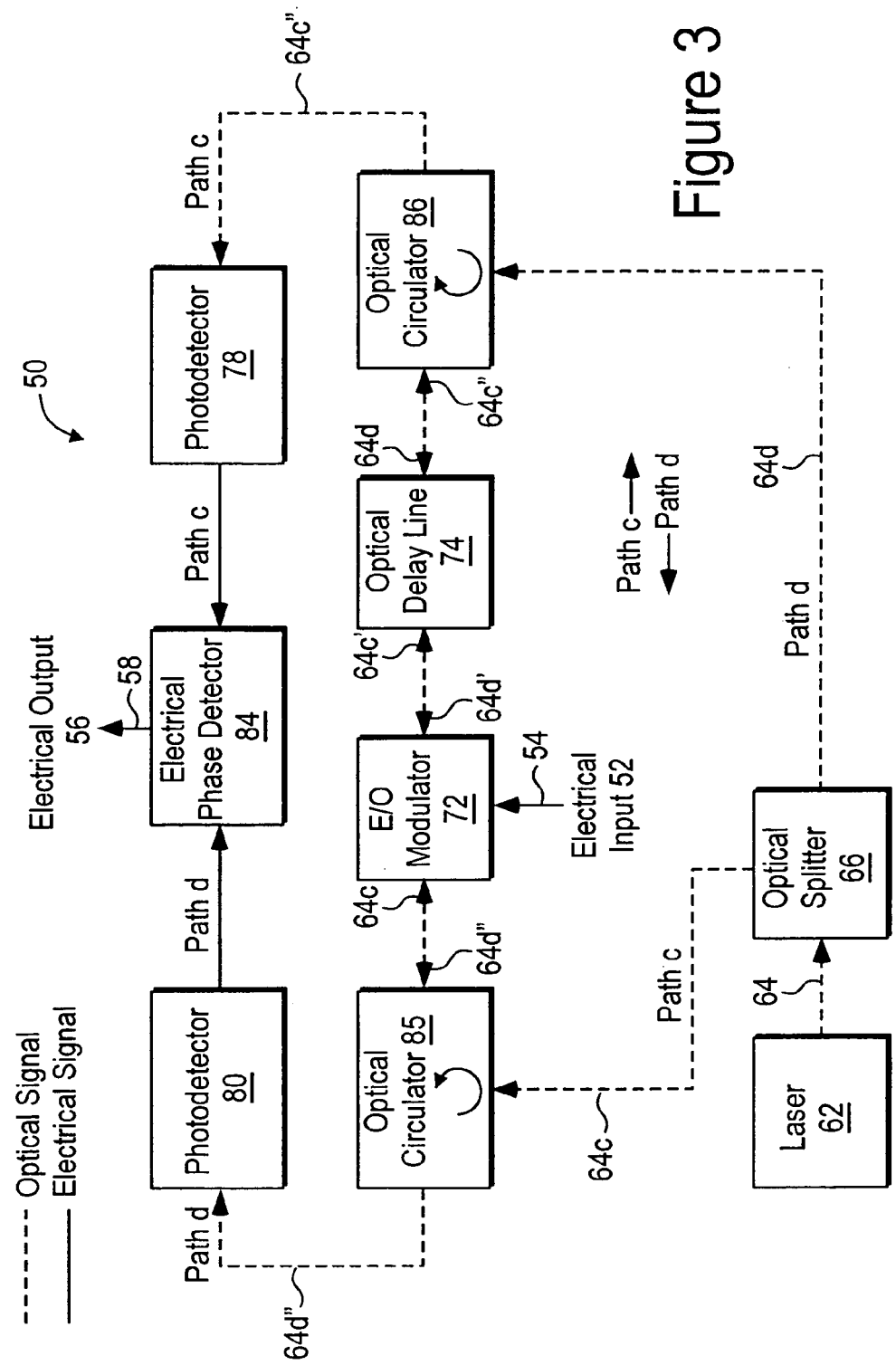
FIG. 3 is a block diagram that schematically illustrates an electro-optic delay line discriminator according to another embodiment of the invention.

FIG. 3 is a block diagram of an alternate embodiment that is the same as FIG. 2 except that optical directional couplers 70 and 76 have been replaced by optical circulators 85 and 86, respectively. The operation of this embodiment is same as that of the embodiment of FIG. 2, except that the ideal 6 dB optical loss of a round trip through the coupler is reduced to the ideal 0 dB loss of a circulator.

Figure 4:
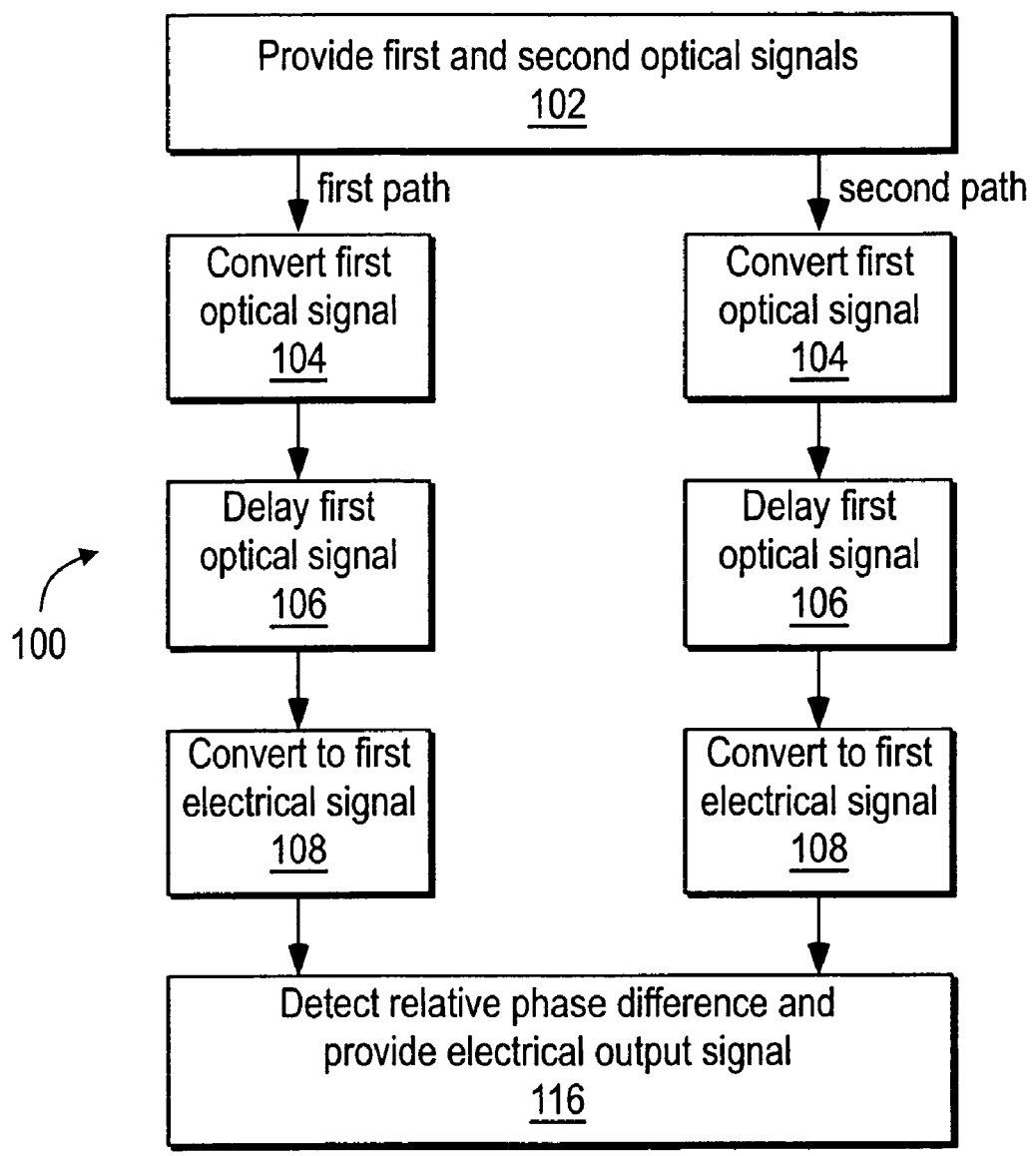
FIG. 4 is a flow chart that illustrates steps of a method for reducing noise in an electro-optic delay line discriminator according to another embodiment of the invention.

FIG. 4 is a block diagram that schematically illustrates a method for reducing noise in an electro-optic delay line discriminator according to another embodiment of the invention. The method is generally designated by reference number 100 and begins by providing first and second optical signals from an optical signal source (step 102). The first optical signal, directed along a first path, is first converted to a first corresponding optical signal that corresponds to an electrical input signal of the electro-optic delay line discriminator (step 104), and the first corresponding optical signal is then delayed (step 106). The first, delayed corresponding optical signal is then converted back to a corresponding first electrical signal (step 108).

The second optical signal, directed along a second path, on the other hand, is first delayed (step 110), and the delayed, second optical signal is then converted to a second corresponding, delayed optical signal that corresponds to the electrical input signal (step 112). The second corresponding, delayed optical signal is then converted back to a second corresponding electrical signal (step 114).

The relative phase difference between the first and second corresponding electrical signals is detected, and an electrical output signal is provided from the electro-optic delay line discriminator in response to the detected signals (step 116).

Because, in the method schematically illustrated in FIG. 4, the first optical signal is converted to an optical signal that corresponds to the electrical input signal before the signal is delayed, when the first optical signal is converted back to an electrical signal, the corresponding electrical signal will also be delayed. The second optical signal, however, is delayed before it is converted to a signal that corresponds to the electrical input signal. Accordingly, when the second optical signal is converted back to a corresponding electrical signal, the second corresponding electrical signal will not be delayed. The first corresponding electrical signal will thus be delayed with respect to the second corresponding electrical signal, providing a proper condition for operation of the electro-optic delay line discriminator. At the same time, the first and second optical signals will both be delayed by the same amount, thus canceling out optical signal source noise.

An electro-optic delay line discriminator according to the embodiments described herein uses an optical fiber to implement an optical delay line. The optical fiber is preferably of the type that introduces very little noise, for example, low loss, single mode optical fiber, although other optical fibers and other types of optical delay lines may be used, and the invention is not limited to any particular optical delay line.

Furthermore, because an electro-optic delay line discriminator according to embodiments described herein provides for optical signal source noise cancellation, a relatively inexpensive laser, for example, a diode laser, may be used as the optical signal source, although other lasers and other types of optical signal sources may be used, and the invention is not limited to any particular optical signal source.

In addition, although in the embodiments described herein, the electrical-to-optical converters comprise E/O modulators, and the optical-to-electrical converters comprise photodetectors, other types of electrical-to-optical and optical-to-electrical converters may be used, and the invention is not limited to any particular converters.

An electro-optic delay line discriminator according to the present invention can be used in substantially any application that requires a delay line discriminator. The invention can be useful for the optical generation of microwaves, and may also be used to either clean up the frequency noise of a free standing oscillator or to construct an oscillator.

While what has been described constitute embodiments of the invention, it should be recognized that the invention can be varied in many ways without departing from the scope thereof. Because the invention can be varied in many ways, it should be understood that the invention should be limited only insofar as is required by the scope of the following claims.

I claim:

1. An electro-optic delay line discriminator comprising:
   an optical signal source producing an optical signal;
   an optical splitter for splitting the optical signal from the optical signal source into first and second optical signals;
   first and second paths for transmitting the first and second optical signals;
   the first path including:
      an electrical-to-optical converter responsive to an electrical input signal for converting the first optical signal to a first corresponding optical signal corresponding to the electrical input signal; and
      an optical delay line following the electrical-to-optical converter for delaying the first corresponding optical signal;
   the second path including:
      an optical delay line for delaying the second optical signal; and
      an electrical-to-optical converter responsive to the electrical input signal for converting the delayed second optical signal to a second corresponding optical signal corresponding to the electrical input signal;
   an optical-to-electrical converter in each of the first and second paths for converting the first and second corresponding optical signals to first and second corresponding electrical signals, respectively; and
   a detector responsive to a relative phase difference between the first and second corresponding electrical signals for providing an electrical output signal from the electro-optic delay line discriminator.

2. The electro-optic delay line discriminator according to claim 1, where the optical signal source comprises a diode laser.

3. The electro-optic delay line discriminator according to claim 1, where the optical delay line in each of the first and second paths comprises an optical fiber delay line in each of the first and second paths.

4. The electro-optic delay line discriminator according to claim 1, where the optical fiber delay line in each of said first and second paths comprises a low loss, single mode optical fiber.

5. The electro-optic delay line discriminator according to claim 1, where the electrical-to-optical converter in each of the first and second paths comprises a first electrical-to-optical converter in the first path and a second electrical-to-optical converter in the second path, and the optical delay line in each of the first and second paths comprises a first optical delay line in the first path and a second optical delay line in the second path.

6. The electro-optic delay line discriminator according to claim 1, where the electrical-to-optical converter in each of the first and second paths comprises a single electrical-to-optical converter in both the first and second paths, and the optical delay line in each of the first and second paths comprises a single optical delay line in both the first and second paths.

7. The electro-optic delay line discriminator according to claim 6, further including first and second optical directional couplers for directing the first and second optical signals along the first and second paths.

8. The electro-optic delay line discriminator according to claim 6, further including first and second optical circulators for directing the first and second optical signals along the first and second paths.

9. A method for reducing noise in an electro-optic delay line discriminator, comprising:
   splitting an optical signal from the optical signal source into the first and second optical signals,
   providing first and second optical signals from an optical signal source;
   converting the first optical signal to a first corresponding optical signal that corresponds to an electrical input signal and delaying the first corresponding optical signal;
   delaying the second optical signal and converting the delayed second optical signal to a second corresponding optical signal that corresponds to the electrical input signal;
   converting the first and second corresponding optical signals to corresponding first and second electrical signals; and
   detecting a phase difference between the first and second corresponding electrical signals and providing an electrical output signal.

10. The method according to claim 9, where the step of converting the first optical signal comprises amplitude modulating the first optical signal with the electrical input signal, and where the step of converting the delayed second optical signal comprises amplitude modulating the delayed second optical signal with the electrical input signal.

11. The method according to claim 9, where delaying the first corresponding optical signal and delaying the second optical signal are performed with different optical delay lines, and where converting the first optical signal and converting the delayed second optical signal are performed with different electrical-to-optical converters.

12. The method according to claim 9, where delaying the first corresponding optical signal and delaying the second optical signal are performed with the same optical delay line, and where converting the first optical signal and converting the delayed second optical signal are performed with the same electrical-to-optical converter.

13. The method according to claim 9, where the optical signal source comprises a diode laser.

14. A method for reducing optical source noise in an electro-optical delay line discriminator, comprising:
- splitting an optical signal from the optical source into first and second optical signals providing first and second optical signals from the optical source;
- converting the first optical signal to a first corresponding optical signal that corresponds to an electrical input signal and delaying the first corresponding optical signal;
- delaying the second optical signal and converting the delayed second optical signal to a second corresponding optical signal that corresponds to the electrical input signal;
- converting the first and second corresponding optical signals to corresponding first and second electrical signals; and
- detecting a phase difference between the first and second corresponding electrical signals and providing an electrical output signal.

15. The method according to claim 14, where delaying the first corresponding optical signal and delaying the second optical signal are performed with different optical delay lines, and where converting the first optical signal and converting the delayed second optical signal are performed with different electrical-to-optical converters.

16. The method according to claim 14, where delaying the first corresponding optical signal and delaying the second optical signal are performed with the same optical delay line, and where converting the first optical signal and converting the delayed second optical signal are performed with the same electrical-to-optical converter.

17. The method according to claim 14, where the optical source comprises a laser, and where the optical source noise comprises relative intensity noise and frequency modulation noise of the laser.

* * * * *